(12) United States Patent
Bresemann et al.

(10) Patent No.: US 7,024,539 B2
(45) Date of Patent: *Apr. 4, 2006

(54) RESISTOR IDENTIFICATION CONFIGURATION CIRCUITRY AND ASSOCIATED METHOD

(75) Inventors: David P. Bresemann, Austin, TX (US); Alan F. Hendrickson, Austin, TX (US); Robert C. Wagner, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 514 days.

This patent is subject to a terminal disclaimer.

(21) Appl. No.: 10/190,136

(22) Filed: Jul. 3, 2002

(65) Prior Publication Data

US 2003/0005274 A1 Jan. 2, 2003

Related U.S. Application Data

(63) Continuation-in-part of application No. 09/617,350, filed on Jul. 17, 2000, now Pat. No. 6,748,515.

(60) Provisional application No. 60/359,781, filed on Feb. 26, 2002.

(51) Int. Cl.
*G06F 15/00* (2006.01)

(52) U.S. Cl. .......................... 712/36; 712/37

(58) Field of Classification Search ................. 712/36, 712/35, 37, 38, 32; 713/2, 100; 710/10, 710/8, 62–63; 379/399.02, 412

See application file for complete search history.

(56) References Cited

U.S. PATENT DOCUMENTS 5,192,999 A * 3/1993 Graczyk et al. ............ 348/552

| 5,794,032 | A | 8/1998 | Leyda |
| 5,870,046 | A | 2/1999 | Scott et al. |
| 6,021,447 | A | 2/2000 | Szeto et al. |
| 6,073,016 | A | 6/2000 | Hulthen et al. |
| 6,091,806 | A | 7/2000 | Rasmus et al. |
| 6,160,885 | A | 12/2000 | Scott et al. |
| 6,167,472 | A | 12/2000 | Mitra et al. |
| 6,192,420 | B1 | 2/2001 | Tsai et al. |
| 6,205,219 | B1 | 3/2001 | Hollenbach et al. |
| 6,259,780 | B1 * | 7/2001 | Sherwood et al. ..... 379/142.01 |
| 6,263,075 | B1 | 7/2001 | Fadavi-Ardekani et al. |

(Continued)

*Primary Examiner*—Henry W. H. Tsai
(74) *Attorney, Agent, or Firm*—O'Keefe, Egan & Peterman LLP

(57) ABSTRACT

Programmable on-chip identification circuitry and associated method are disclosed that provide integrated circuits with the ability to select and report from multiple different vendor and system identification configurations. The integrated circuit device includes programmable circuitry that utilizes vendor identification, system identification, configuration or other device information provided or selected at least in part based upon selection information from a source external to the integrated circuit. The selection information may be provided through one or more externally generated digital and/or analog control signals that are then processed within the integrated circuit device to select, access and utilize desired identification information stored in an on-chip database. For example, one or more analog control signals can be generated using resistor circuits for which specific selectable resistor configurations map to particular information stored in a look-up table or other database structure within the integrated circuit. The analog control signals are converted to digital values within the integrated circuit, and these digital values are used to select device information from the on-chip database. Furthermore, the selected device information can be stored in on-chip device information registers. And the digital values themselves can be stored and used as identification, configuration or other device information.

55 Claims, 9 Drawing Sheets

U.S. PATENT DOCUMENTS

| | | |
|---|---|---|
| 6,298,006 B1 | 10/2001 | Reohr, Jr. et al. |
| 6,359,973 B1 | 3/2002 | Rahamim et al. |
| 6,385,235 B1 | 5/2002 | Scott et al. |
| 6,408,059 B1 | 6/2002 | Rasmus et al. |
| 6,584,188 B1 * | 6/2003 | Kim .................... 379/211.02 |
| 2002/0034947 A1 * | 3/2002 | Soliman .................... 455/436 |

* cited by examiner

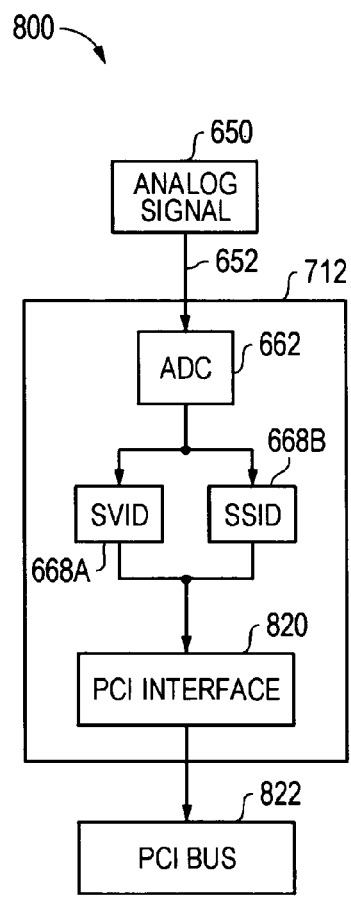 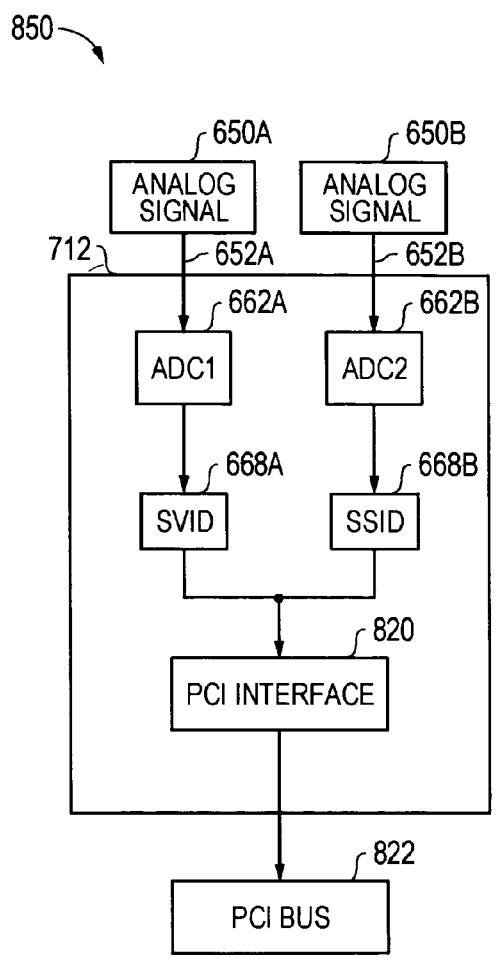
*FIG. 8A*     *FIG. 8B*

RESISTOR IDENTIFICATION CONFIGURATION CIRCUITRY AND ASSOCIATED METHOD

RELATED APPLICATIONS

This application is a continuation-in-part application of patent application Ser. No. 09/617,350, filed Jul. 17, 2000, now U.S. Pat. No. 6,748,515, entitled "PROGRAMMABLE VENDOR IDENTIFICATION CIRCUITRY AND) ASSOCIATED METHOD." The application also claims priority to the following co-pending provisional application: Provisional Application Ser. No. 60/359,781 entitled "RESISTOR IDENTIFICATION CONFIGURATION CIRCUITRY AND ASSOCIATED METHOD," which was filed on Feb. 26, 2002.

TECHNICAL FIELD OF THE INVENTION

The present invention relates to vendor and system identification information for electronic devices, and more particularly to vendor identification information for plug-and-play applications in computer systems meeting operational features of the Audio CODEC '97 Component Specification and features of the PCI local bus standard.

BACKGROUND

The Audio CODEC '97 Component Specification (AC97) is sponsored by Intel Corporation and provides a standard interface for computer system audio applications, including modem CODEC functionality. In part, the AC97 specification contemplates that devices will report their vendor information to the operating system for plug-and-play device driver installation, for example, with the Microsoft WINDOWS operating system. The AC97 specification provides two fixed addresses (namely, hex 7C and hex 7E) for vendors to report identifying codes to allow boot software to load drivers compatible with the given vendor identification codes. In addition, the PCI local bus standard provides for reporting 16-bit product specific identification codes. These codes include a subsystem vendor identification (SVID) and a subsystem identification (SSID). The PCI local bus standard provides for these identification codes to be stored in the PCI configuration register space at address 2Ch (SVID) and 2Eh (SSID). Traditionally, devices have been manufactured such that they store fixed vendor identification information and are configured to report this information when queried.

One problem associated with this fixed vendor identification scheme, however, is that it does not provide a solution for a device supplied through multiple vendors or a device with multiple different configurations. For example, a single integrated circuit vendor may sell a hardware solution to multiple modem software vendors, or alternatively, a single modem vendor may sell one of several software revisions bundled with a single hardware revision. In such situations, it would be advantageous for the same piece of silicon to report different vendor identification information from the vendor identification registers. The AC97 specification and the PCI local bus standard, however, do not contemplate a solution to this problem.

SUMMARY OF THE INVENTION

In accordance with the present invention, programmable on-chip identification circuitry and associated method are disclosed that provide a solution to this multiple vendor and system identification problem and to provide the ability to program on-chip device identification, device configuration, device operational parameters or other device information in a cost effective manner. An integrated circuit includes control circuitry that utilizes vendor identification, system identification, device configuration or other device information provided or selected at least in part based upon selection information from a source external to the integrated circuit. The selection information, for example, may be provided through one or more externally generated digital and/or analog control signals that are then processed within the integrated circuit device to select, access, utilize and/or store desired identification, configuration or device information. For example, one or more analog control signals can be generated using resistor identification configuration circuits for which specific selectable resistor configurations map to particular information stored in a look-up table or other database structure within the integrated circuit. The analog control signal can be converted to a digital value on-chip, and control circuitry can use the digital value to select information from the on-chip database and, if desired store the selected device information in on-chip device information registers. Still further, the digital value itself can be stored and used as identification, configuration or other device information.

DESCRIPTION OF THE DRAWINGS

It is noted that the appended drawings illustrate only exemplary embodiments of the invention and are, therefore, not to be considered limiting of its scope, for the invention may admit to other equally effective embodiments.

FIGS. 8A and 8B are block diagrams for the use of a single analog control signal and multiple analog control signals, respectively.

DETAILED DESCRIPTION OF THE INVENTION

The present invention contemplates an integrated circuit device having on-chip programmable circuitry that may receive and store vendor, system or other identification information. By being programmable, the programmable circuitry allows for vendor or other ID information for multiple device configurations and/or multiple vendor supplied devices to be accurately reported to external devices. In a particular embodiment, the present invention contemplates direct-access-arrangement (DAA) circuitry having on-chip programmable circuitry that may be loaded with vendor identification, system identification or other device information at least in part based upon selection information received from an external source. In addition, this external source may also be programmable, so that it may be loaded with desired vendor identification information that can be transferred and loaded into the DAA circuitry. In addition, external digital and/or analog control signals can be received by the DAA circuitry and the processed to select identification information from sets of information stored in an on-chip database. The present invention allows a single hardware DAA solution to be utilized by different software vendors, who each add their own respective software functionality, and to be utilized by a single software vendor, who desires to bundle different software functionality or revisions with the single hardware DAA solution. In this way, an integrated circuit may be designed and manufactured to provide a single hardware solution for a variety of different software or other programmable configurations.

Figure 1:
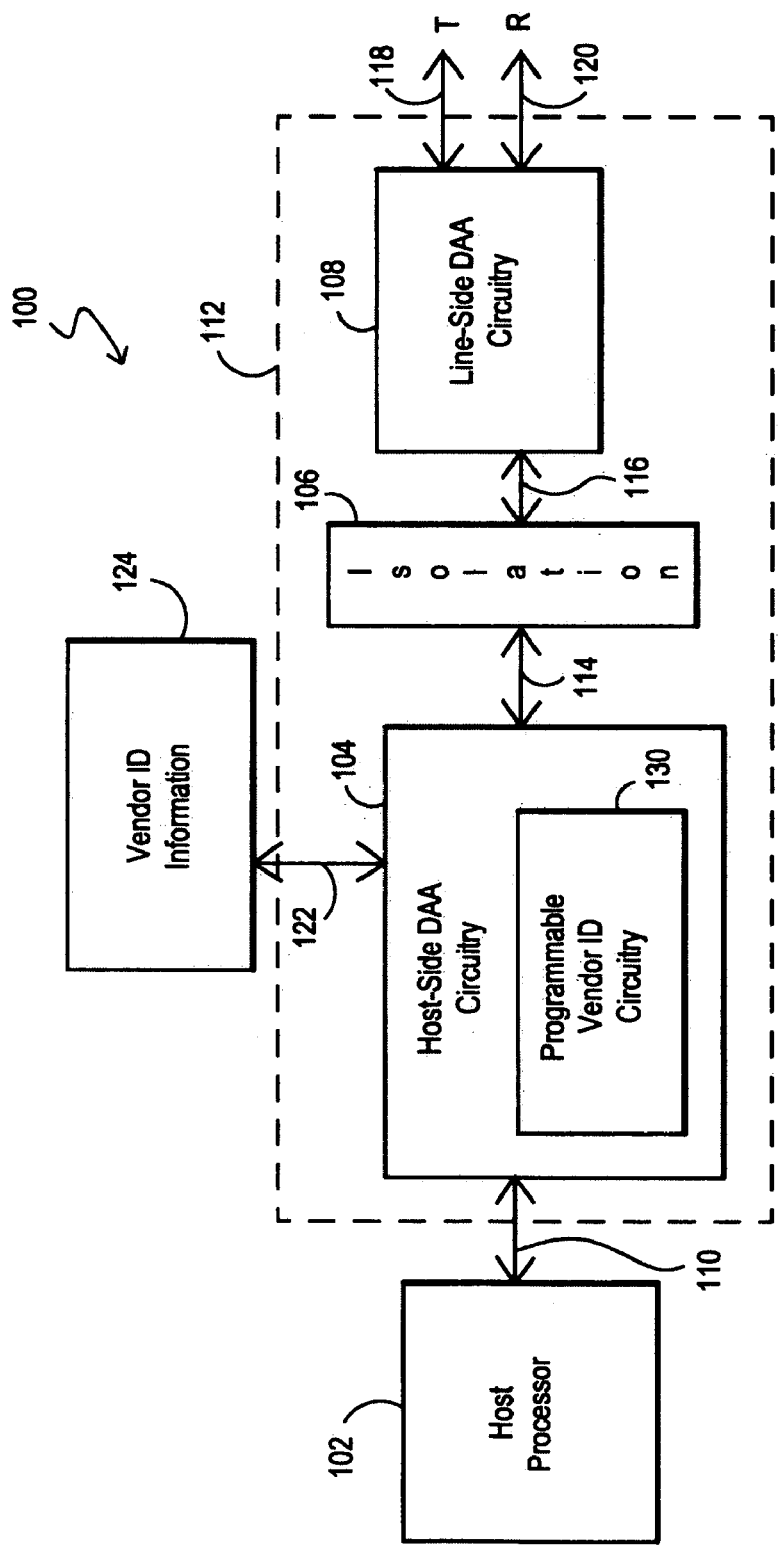
FIG. 1 is a block diagram of host-side and line-side direct-access-arrangement (DAA) circuitry including programmable on-chip vendor identification circuitry, according to the present invention.

FIG. 1 is a block diagram for an embodiment 100 according to the present invention including programmable on-chip vendor identification circuitry 130, according to the present invention. A host processor 102 is coupled to direct-access-arrangement (DAA) circuitry 112 through an interface 110. The DAA circuitry 112 is configured to allow the host processor 102 to communicate with the tip (T) 118 and ring (R) 120 of a telephone line. The DAA circuitry 112 includes host-side DAA circuitry 104, an isolation barrier 106, line-side DAA circuitry 108, and isolation communication interfaces 114 and 116. The host-side DAA circuitry 104 and line-side DAA circuitry 108 may each include a single integrated circuit. An example of such DAA circuitry is described in U.S. Pat. No. 5,870,046, which is assigned to Silicon Laboratories, Inc., as well as co-pending U.S. patent application Ser. No. 09/035,175 entitled "Direct Digital Access Arrangement Circuitry and Method for Connecting Phone Lines," also assigned to Silicon Laboratories, Inc., are hereby each incorporated by reference in its entirety.

In addition, each of the following U.S. patent applications, which are related in subject matter to the current application and are filed concurrently herewith, is hereby incorporated by reference in its entirety: Ser. No. 09/617,465, filed Jul. 17, 2000, entitled "TELEPHONE RING-VALIDATION AND WAKE-ON-RING CIRCUITRY AND ASSOCIATED METHODS" by Alan F. Hendrickson; Ser. No. 09/617,757, filed Jul. 17, 2000, entitled "CALLER ID DATA-REPORTING MECHANISM FOR ELECTRONIC DEVICES AND ASSOCIATED METHODS" by Alan F. Hendrickson; Ser. No. 09/617,079, filed Jul. 17, 2000, entitled "TELEPHONE HANG-UP TIMEOUT CIRCUITRY AND DATA TIMEOUT CIRCUITRY FOR ELECTRONIC DEVICES AND ASSOCIATED METHODS" by Alan F. Hendrickson; and Ser. No. 09/617,405, filed Jul. 17, 2000, entitled "DATA-SECURITY CIRCUITRY FOR ELECTRONIC DEVICES AND ASSOCIATED METHODS" by Alan F. Hendrickson.

According to the present invention, the DAA circuitry 112 includes programmable on-chip vendor identification circuitry 130 within an integrated circuit portion of host-side DAA circuitry 104. The programmable circuitry 130 may be loaded with vendor identification information 124 through interface 122, so that the programmable circuitry 130 stores vendor identification information provided at least in part from a source external to the integrated circuit portion of host-side DAA circuitry 104. This configuration allows for the integrated circuit portion of the host-side DAA circuitry to be a single hardware solution for multiple vendors or multiple configurations from a single vendor. Thus, when the DAA circuitry 112 reports vendor information to the host processor 102, for example, when device drivers are required to be installed in a plug-and-play operating system environment, the proper vendor ID information may be provided even though there are a number of configurations for the hardware and software that provides the functionality of the DAA circuitry 112.

For example, a modem vendor utilizing the DAA circuitry 112 may make product distinctions through the software feature set and through hardware components. Thus, the modem vendor may utilize a single design for manufacture of a product, yet select different software feature sets through the vendor ID information 124. In this way, different products with different features and at different costs may be provided to customers without having to alter the basic product design. In addition, the modem vendor may utilize the vendor ID information 124 to allow for different hardware configurations. For example, a modem vendor may manufacture printed circuit boards that have multiple possible configurations that support integrated circuits mounted on the printed circuit boards. The vendor ID information 124 may be utilized to install a driver setting that matches the integrated circuit operation to the particular board configuration. Still further, as indicated above, the vendor ID information 124 may allow for particular drivers to be loaded for the modem product, for example, during a boot-up sequence for a personal computer.

Figure 2:
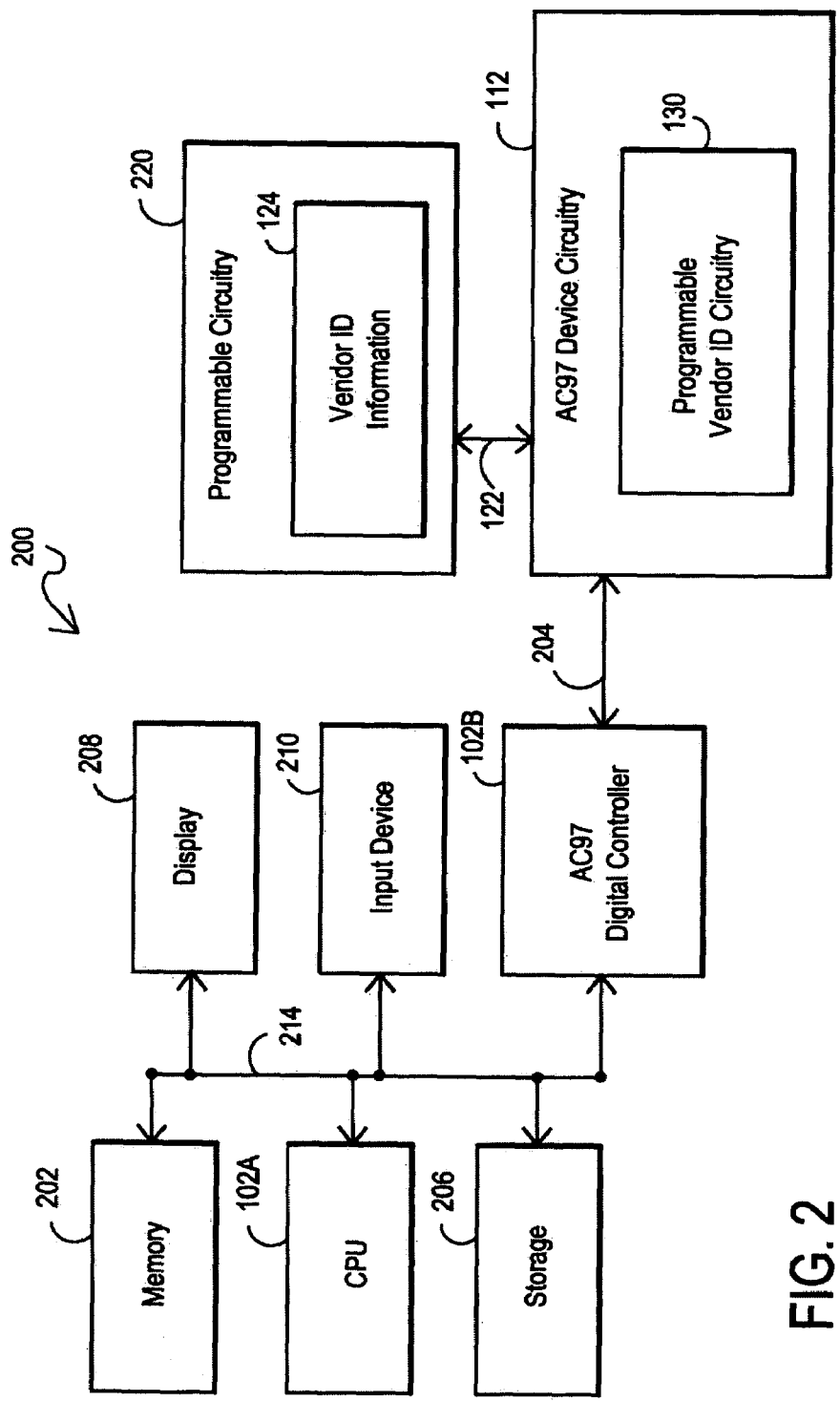
FIG. 2 is a block diagram of a computer system including AC97 device circuitry having a programmable on-chip vendor identification circuitry, according to the present invention.

It is noted that the vendor ID information 124 may be stored in programmable circuitry 220, as depicted in FIG. 2 (described in more detail below), that is external to the integrated circuit portion 104 of the DAA circuitry 112. The programmable nature of this circuitry tends to enhance the ease of configuration for a vendor utilizing the programmable vendor ID circuitry 130 of the DAA circuitry 112, according to the present invention. If desired, the programmable circuitry 220 may be programmed by the vendor through the DAA circuitry 112 to store the vendor ID information 124. Thus, once a vendor has the DAA circuitry 112 and the programmable circuitry 220, the vendor may utilize the communication interface for the DAA circuitry 112 to load the programmable circuitry with the desired vendor ID information 124. As discussed above, this vendor ID information 124 may provide for any of a wide variety of different software and/or hardware configurations. One embodiment for such programmable circuitry 220 is depicted with respect to FIG. 5. In particular for this embodiment 500, the programmable circuitry is an EEPROM (Electrically Erasable Programmable Read Only Memory).

It is noted that, if desired, the vendor identification information 124 may also include on-chip information, such as, for example, information in a configuration look-up table. This vendor identification information 124 may then be selected and loaded into the programmable circuitry 130 depending at least in part upon a control signal external to the integrated circuit on which the programmable circuitry 130 resides. In this way, vendor ID information for different software configurations may be selected from the vendor ID table through a simple programmed off-chip signal supplied to the integrated circuit. For example, a simple hard-wired 2-bit signal may be provided to the integrated circuit to choose between four different configurations. It is further noted that other techniques may also be employed to provide vendor ID information, including programmable vendor ID information, to on-chip programmable vendor ID circuitry, according to the present invention.

Figure 5:
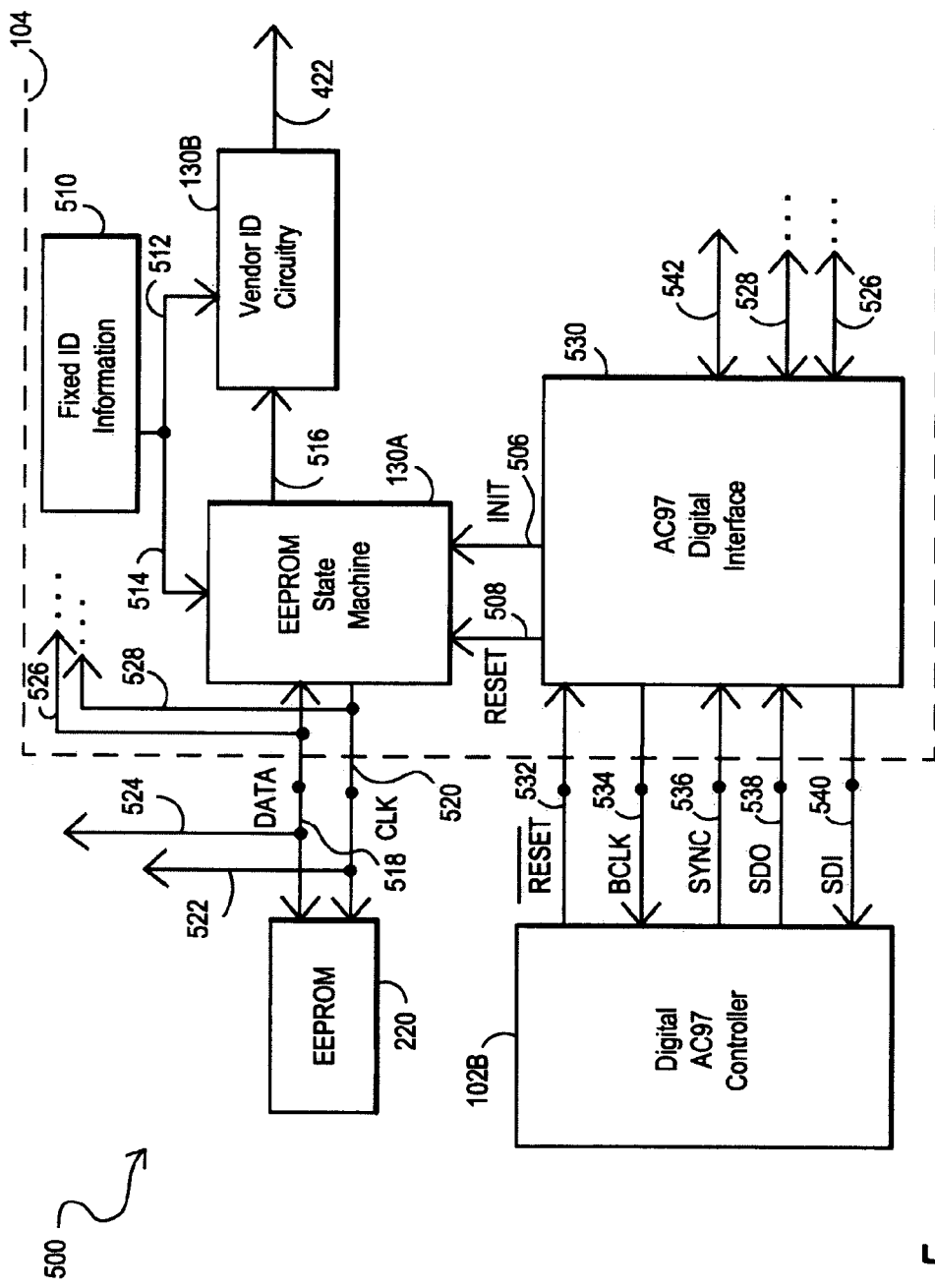
FIG. 5 is a block diagram of an embodiment utilizing a EEPROM to provide vendor identification information from off-chip, according to the present information.

As indicated above, the present invention is particularly useful where the host processor 102 is at least in part a digital controller configured to meet and operate within the AC97 controller operational specifications, and the DAA circuitry 112 is also configured to meet and operate within AC9 CODEC operational specifications, and more particularly, the modem CODEC specifications. The embodiment depicted with respect to FIG. 5 provides a more detailed embodiment directed to an AC97 application. It is noted that as used herein AC97 operational specifications are contemplated as including the current AC97 operational specifications and any revisions or updates to this specification, as well as any follow-on specifications that incorpor identification features. The Audio CODEC '97 Component Specification (AC97), revision 2.1 (May 22, 1998) is hereby incorporated by reference in its entirety.

FIG. 2 is a block diagram of another embodiment, according to the present invention. In this embodiment, a computer system 200 is depicted that includes a central processing unit (CPU) 102A that may be coupled to various other devices through an interfaces or buses 214, as would be understood to one of skill in the art. For example, the CPU 102A may be coupled to a memory device 202, a storage device 206, a display device 208, an input device 210, and/or other devices. In addition, CPU 102A may be coupled to a digital controller 102B that is configured to meet AC97 operational specifications. It is noted that although the digital controller 102B is shown as a separate block in FIG. 2, the AC97 control functionality may be located anywhere desired, including on an integrated circuit that is also the CPU 102A. It is also noted that the CPU 102A and the AC97 digital controller 102B may together or individually be the host processor 102 in FIG. 1, as desired.

Referring again to FIG. 2, the digital controller 102B is coupled to device circuitry 112 through interface 204. It is noted that interface 204 may be a subset number of signal lines 122 going to the device circuitry 112. As with the digital controller 102B, the device circuitry 112 in FIG. 2 is configured to meet AC97 operation specifications. According to the present invention, the device circuitry 112 may include at least one integrated circuit that has programmable vendor identification circuitry 130. The programmable circuitry 130 may be loaded with vendor ID information 124 through interface 122, so that the programmable circuitry 130 stores vendor ID information 124 provided or selected at least in part from a source external to the integrated circuit portion of the AC97 device circuitry 112. As depicted in FIG. 2, programmable circuitry 220 stores the vendor ID information 124.

Figure 3:
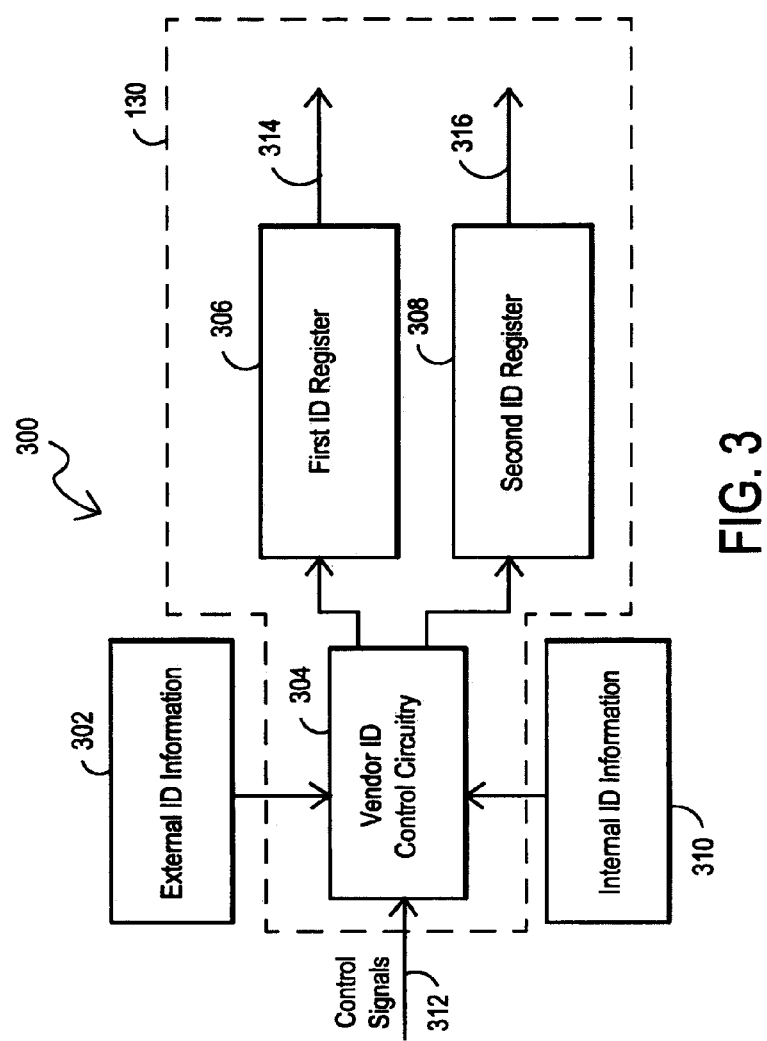
FIG. 3 is a block diagram of programmable registers that may be loaded with first or second vendor identification information, according to the present invention.

FIG. 3 is an embodiment 300 including programmable vendor identification circuitry 130, according to the present invention. In the embodiment 300 depicted, the programmable vendor identification (ID) circuitry 130 includes a first ID register 306 and a second ID register 308 that may be accessed and loaded with desired information. Vendor ID control circuitry 304 receives control signals 312 and the vendor ID information for loading into the first and second ID registers 306 and 308, which in turn provide output signals 314 and 316. The vendor identification sources 302 and 304 intended to show that at least a portion of the vendor ID information may come from an ID information source 302 that is external to the integrated circuit. Also, a portion of the vendor ID information may come from an ID information source 310 that is internal to the integrated circuit. It is noted that although a first and a second ID registers 306 and 308 are depicted, any number of registers or other circuitry configured to receive and store identification information could be utilized, as desired by one implementing devices in accordance with the present invention.

Figure 4:
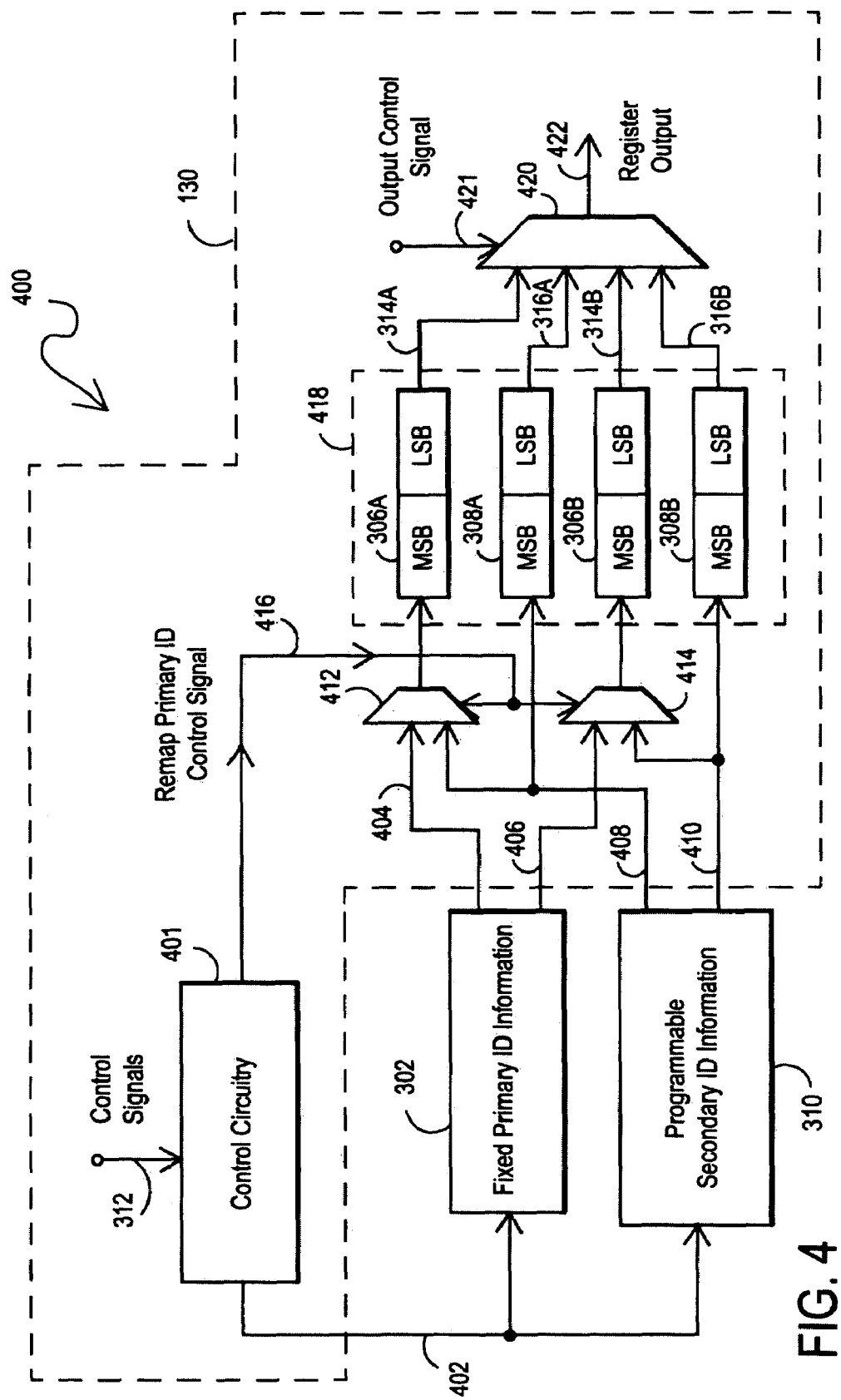
FIG. 4 is a block diagram of a more detailed embodiment having multiple registers that may be loaded with fixed primary vendor identification information and programmable secondary vendor identification information, according to the present invention.

Now referring to FIG. 4, a block diagram is provided for a more detailed embodiment 400, according to the present invention. In this embodiment, vendor ID information is provided from a fixed source 302, which provides predetermined ID information that cannot be programmed, and a programmable source 310, which provides ID information that may be modified or programmed. In addition, this embodiment contemplates primary vendor and secondary vendor information, such that the source 302 provides primary vendor ID information, and source 310 provides secondary vendor information. It is noted that the any desired number of levels (e.g., primary, secondary, etc.) or types of vendor information may be provided and that any combination of fixed and programmable source vendor identification information may be utilized, as long as there exists on-chip programmable vendor identification circuitry that may be loaded at least in part with vendor identification information, according to the present invention.

The embodiment for the programmable vendor ID circuitry 130 within FIG. 4 includes control circuitry 401 that receives control signals 312 and outputs various control signals, including signals 402 to the vendor identification sources 302 and 310 and the REMAP signal 416. The fixed primary ID information source 302 provides an output 404 to selection circuitry 412 and an output 406 to selection circuitry 414. The programmable secondary ID information source 310 provides an output 408 to the selection circuitry 412 and directly to register 308A within on-chip registers 418. The programmable secondary ID information source 310 also provides an output 410 to the selection circuitry 414 and directly to register 308B within on-chip registers 418. The output of selection circuitry 412 is provided to register 306A, and the output of selection circuitry 414 is provided to register 306B. The registers 306A, 306B, 308A, and 308B are coupled through output paths 314A, 314B, 316A, and 316B, respectively, to selection circuitry 420. The selection circuitry 420 is controlled by output control signal 421 and provides the contents of the selected register as register output 422. The selection circuitry 412 and selection circuitry 414 are both controlled by the REMAP signal 416. It is noted that selection circuitry 412, 414 and 420 may be for example multiplexers that between multiple inputs based upon control signals.

It is noted that each of the registers 306A, 306B, 308A and 308B may be, for example, 16-bit registers, including two 8-bit bytes of information with one byte representing the most significant byte (MSB) and the other byte representing the least significant byte (LSB). In addition, the registers 306A, 306B, 308A and 308B may represent only a portion of the registers within on-chip registers 418. For example, in the AC97 specification, there are numerous predefined registers that are designated to hold various types of information. Two of these registers are designated to hold vendor identification information. In the AC97 specification, these two predefined registers are designated 7C and 7E. In the embodiment of FIG. 4, register 306A may be understood to represent AC97 register 7C, and register 306B may be understood to represent AC97 register 7E.

According to the present invention, registers 7C and 7E are programmable, such that vendor ID information provided at least in part from an off-chip source may be loaded into the registers 306A and 306B. In contrast, conventional AC97 devices have hard-wired or fixed vendor ID information that is supplied to the registers 7C and 7E. In addition, according to the present invention, additional registers 308A and 308B are provided. If desired, they may be given designations with the AC97 scheme, such as 76 and 78. The purpose of additional registers 308A and 308B is to provide additional space for receiving and storing vendor ID information. More particularly, these registers 308A and 308B may be utilized in conjunction with registers 306A and 306B to provide information for multiple vendors. For example, registers 306A and 306B may be utilized to store vendor information for a company that manufactured the basic AC97 device, such as DAA circuitry as depicted in FIG. 1. Registers 308A and 308B may then be utilized to store vendor information for a company that provides additional software features for the AC97 device, or that provides a hardware system configuration utilizing the AC97 device as a subset. It is again noted that the number of registers and how they are utilized may be modified, as desired, without departing from on-chip programmable vendor ID circuitry, according to the present invention.

In operation of the embodiment 400 shown in FIG. 4, the two sources of vendor ID information 302 and 310 provide information as to a primary vendor (e.g., the hardware manufacturer) and a secondary vendor (e.g., the software enhancements supplier). In the embodiment shown, registers 308A and 308B are always loaded with secondary ID information from source 310. Registers 306A and 306B may be loaded either from source 302 or from source 310, depending upon the state of REMAP signal 416 that controls the MUX 412 and the MUX 414. As contemplated in the embodiment, the REMAP signal 416 is asserted to select the secondary ID information source 310 if it is desired to remap the primary ID registers 306A and 306B to hold the secondary ID information. The default condition is expected to be for the primary ID registers 306A and 306B to be loaded with the primary ID information from source 302. This REMAP feature helps to provide compatibility with legacy systems that only have functionality to read information from a limited number of registers, such as the two vendor ID registers 7C and 7E in the AC97 specification. It is again noted that the number of sources and how they are utilized may be selected as desired to load on-chip programmable vendor ID circuitry 130, according to the present invention.

FIG. 5 is a block diagram of an embodiment 500 utilizing programmable circuitry, such as an EEPROM 220, to provide vendor identification information from an off-chip source, according to the present information. The dotted line represents the integrated circuit boundary for an integrated circuit portion of host-side DAA circuitry 104 from FIG. 1. The integrated circuit for DAA circuitry 104 includes an AC97 digital interface 530, EEPROM state machine 130A, vendor ID circuitry 130B, and fixed ID information source 510. External to the integrated circuit are the EEPROM 220 and an AC97 digital controller 102B.

The pins connecting the EEPROM 220 and the EEPROM state machine 130A include the DATA pin 518, through which data, such as vendor ID information or control information, may be written to or read from the EEPROM 220. The pins also include a CLK pin 520 through which the integrated circuit 104 may control input and output timing for the EEPROM 220. These pins may also double as general purpose input/output (GPIO) pins on the integrated circuit. Thus, if other devices desire to utilize the pins for other purposes, they may do so. In particular, the pins may be utilized after the vendor ID information has been loaded into the on-chip programmable vendor ID circuitry 130B. If this is to be done, connections 522 and 524 may be utilized to take advantage of the pins 518 and 520. In addition, once on-chip, the connections 526 and 528 may be utilized to communicate this other device information to the rest of the integrated circuit 104.

In addition, it is contemplated that the external programmable circuitry 220 may be programmed through the integrated circuit 104. For example, the connections 526 and 528 may be connected to the AC97 digital interface 530, as shown in FIG. 5, so that the EEPROM 220 may be programmed through the AC97 digital interface 530. More specifically, the external AC97 digital controller 102B may configure the programmable circuitry 220 through the AC97 digital interface 530. It is also noted that other circuitry could be provided, as desired, to provide for programming of the programmable circuitry 220 through the connections 526 and 528.

The pins connecting the digital controller 102B to the digital interface 530 include a reset (RESET_) pin 532, a bit clock (BCLK) pin 534, a synchronization (SYNC) pin 536, a serial data output (SDO) pin 538, and a serial data input (SDI) pin 540. In the AC97 specification environment, the RESET_pin 532 is an active low input signal to the circuitry 104 that is used to reset all control registers to a defined, initialized state. The BCLK pin 534 is a serial port bit clock input/output signal that controls serial data input signals and serial data output signals. The BCLK pin 534 is an input to the circuitry 104 if the circuitry 104 is configured as a primary AC97 device, and is an output to the circuitry 104 if the circuitry 104 is configured as a secondary AC97 device. The SYNC pin 536 is an input signal to the circuitry 104 that is a data framing signal that is used to indicate the start and stop of a communication data frame. The SDI pin 540 provides serial communication and control data generated by the digital controller 102B and presented as an input to the circuitry 104. The SDO pin 538 provides serial communication and status data generated as an output signal by the circuitry 104.

The digital interface 530 includes internal interface 542 through which digital interface 530 communicates with other chip circuitry. The digital interface 530 also has a reset signal (RESET) 508 and a initialize signal (INIT) 506 that are provided to the EEPROM state machine 130A, which in turn provides information to the vendor ID circuitry 130B along interface 516. Fixed vendor ID information from source 510 may also be provided directly to the vendor ID circuitry 130B along interface 512, or first to the EEPROM state machine 103A through interface 514. It is noted that the suffix designation "_" for the RESET_pin 532 represents a signal that is active at a low logic level. It is further noted that the active low or active high status of any given signal may be modified as desired depending upon design considerations.

By utilizing an external EEPROM configuration as depicted in FIG. 5, cost is reduced over including EEPROM-type circuitry on the integrated circuit portion of the host-side DAA circuitry 104. An EEPROM process is more expensive than a CMOS process, which is utilized to manufacture the integrated circuitry within the host-side DAA circuitry 104. The solution of FIG. 5, therefore, makes use of an inexpensive and small external EEPROM coupled to CMOS DAA circuitry with a serial interface to download identification data upon reset of the system or upon a command. The serial interface may be, for example, a 2-pin I²C-compatible interface. Example EEPROMs that may be used include an AT24C01 2-Wire Serial EEPROM available from Atmel Corporation.

In operation of the embodiment of FIG. 5, assuming that the vendor ID registers within the vendor ID circuitry 103B are four 2-byte registers as discussed with respect to FIG. 4, the EEPROM communication sequence may include reading 5 bytes from the EEPROM 220. This may occur immediately after a cold reset, or also upon a software command, and the entire latency for completing this task may be about 2 ms. The following process steps are an example:

1. Initialization - Initialization synchronizes the EEPROM 220 and the EEPROM state machine 130A. The initialization step may be started through the RESET signal 508, which is typically applied at power-up or reboot, or started through the INIT signal 506, which is typically applied by software command.
2. Access Header Byte - After initialization, a first header byte is read from the EEPROM 220. This header byte may be, for example, one of two expected patterns. The header byte may identify whether the primary registers 306A and 306B should be remapped to the secondary ID information within the EEPROM 220, or should be loaded with the default primary ID information 302.
3. Access Bytes 2 and 3 - The next two bytes read from the EEPROM 220 are utilized to load the secondary register 308A with 16-bits of information. (If the header byte indicates that a remap should occur, the primary register 306A is loaded with the same information as the secondary register 308A.)
4. Access Bytes 4 and 5 - The final two bytes read from the EEPROM 220 are utilized to load the secondary register 308B with 16-bits of information. (If the header byte indicates that a remap should occur, the primary register 306B is loaded with the same information as the secondary register 308B.)
5. End Process - Once the five bytes of information are read from the EEPROM 220, the vendor ID load procedure is completed. Subsequently, the information stored in the vendor ID circuitry 308B may be output or reported through output 422.

It is noted that during each of the process cycle steps identified above, the EEPROM state machine 130A analyzes whether there are any contentions on the pins 518 and 520. The EEPROM state machine will interpret as a contention any signal on the pins 518 and 520 that is detected as having a logic level opposite of how the EEPROM state machine is trying to drive the pins. In addition, the EEPROM state machine 130A confirms that the responses, such as the header information and acknowledge information, it is receiving from the EEPROM match expected responses. If not, the vendor ID load process may be stopped. The EEPROM state machine 130A, therefore, has error checking mechanisms to help make sure that it does not respond to signals on pins 518 and 520 that were not intended for the EEPROM state machine 130A. This situation could occur, for example, if another device, such as an audio amplifier, is utilizing one of the pins 518 and 520 through external connections 522 and 524.

It is further noted that the process steps set forth above may be modified, as desired, depending upon the external device used to provide vendor ID information to the on-chip programmable vendor ID circuitry. For example, if a EEPROM is utilized as depicted in FIG. 5, the process steps may change depending upon the particular EEPROM utilized. In addition, each EEPROM may have its own set of interface requirements and control signals. Thus, the examples provided in this description should be taken as examples and not as limiting the present invention.

As noted above with respect to FIG. 1, the vendor identification information 124 may include on-chip information, for example, information stored in a look-up table, and this information may be selected and stored in ID registers based at least in part upon external control signals. In the example discussed above, these external control signals were implemented as digital signals that could be provided to the integrated circuit, for example, a 2-bit control word communicated through a 2-pin interface.

Figure 6A:
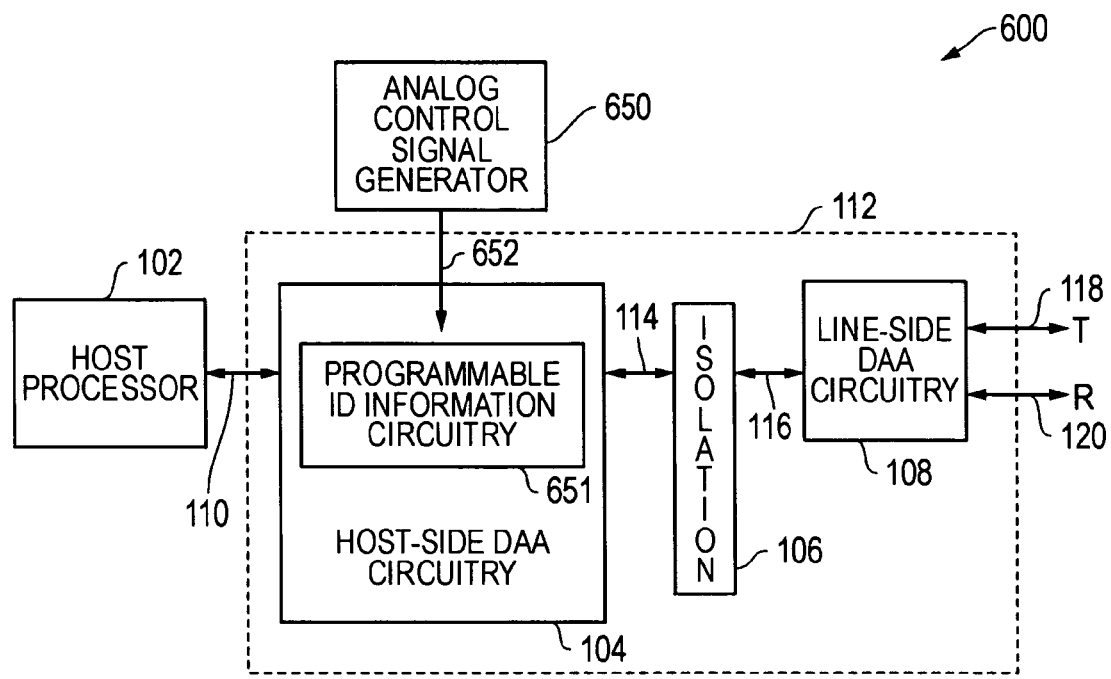
FIG. 6A is a block diagram of an embodiment utilizing an analog control signal from a signal generator to provide information selection information to an integrated circuit.

FIG. 6A illustrates a block diagram of an example embodiment 600 that utilizes an analog control signal generator 650 to create the external control signal 652 that is provided to programmable ID information circuitry 651 and that is utilized to cause identification information from a database, registry or look-up table to be selected, accessed and utilized. The embodiment 600 includes a host processor 102 that is coupled to direct-access-arrangement (DAA) circuitry 112 through an interface 110. The DAA circuitry 112 is configured to allow the host processor 102 to communicate with the tip (T) 118 and ring (R) 120 of a telephone line. The DAA circuitry 112 includes host-side DAA circuitry 104, an isolation barrier 106, line-side DAA circuitry 108, and isolation communication interfaces 114 and 116. The host-side DAA circuitry 104 and line-side DAA circuitry 108 may each include a single integrated circuit. And the DAA circuitry 112 can include programmable on-chip ID information circuitry 651 within an integrated circuit portion of host-side DAA circuitry 104.

Figure 6B:
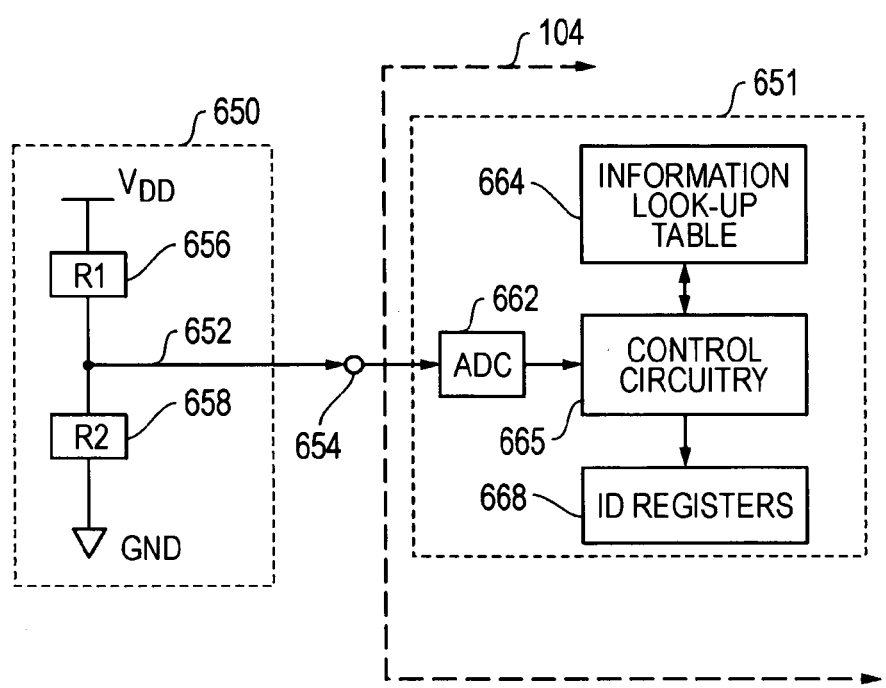
FIG. 6B is a block diagram for an embodiment utilizing a resistor configuration to provide an analog voltage signal that is converted to a digital number to provide the information selection information.

As shown with respect to FIG. 6B, the programmable circuitry 651 may include an ADC 662, control circuitry 665, information look-up table 664, and ID registers 668. The voltage control signal 652 can be converted to a digital number by ADC 662, and the control circuitry 665 can then associate or map the digital number to a given vendor or system identification information that is stored in the look-up table 664. Thus, when the DAA circuitry 112 reports ID information to the host processor 102, for example, when device drivers are required to be installed in a plug-and-play operating system environment, the proper ID information may be provided even though there are a number of configurations for the hardware and software that provides the functionality of the DAA circuitry 112.

For example, a modem vendor may want to produce a single product with a number of different configurations based upon selectable software feature set. Utilizing the DAA circuitry 112 of FIG. 6A, the modem vendor may in fact utilize a single design for manufacture of a product, yet have these different product configurations report different vendor and system ID information based upon the analog control signal provided by generator 650. In this way, different products with different features and at different costs may be provided to customers without having to alter the basic product design. In addition, the modem vendor may utilize the vendor ID information to allow for different hardware configurations. For example, a modem vendor may manufacture printed circuit boards that have multiple possible configurations that support integrated circuits mounted on the printed circuit boards. The vendor ID information may be utilized to install a driver setting that matches the integrated circuit operation to the particular board configuration. Still further, as indicated above, the vendor ID information may allow for particular drivers to be loaded for the modem product, for example, during a boot-up sequence for a personal computer.

Looking again to the embodiment of FIG. 6B, the analog control signal 652 is received by an analog to digital converter ("ADC") 662 which converts the signal to a digital number, such as a five-bit number, that is usable as selection identification information. This digital number is then provided to control circuitry 665, which utilizes the selection identification information to access appropriate information stored with the look-up table 664. The digital number from the ADC 662 varies depending on the analog control signal 652, which can be selectively generated based upon the selection information that is desired to be provided. Once accessed, the identification information within the look-up table 664 can be stored in an appropriate registry, as contemplated by the PCI local bus standard and the AC97 specification, or it can be directly reported through interface 110 to an external device, such as host processor 102.

FIG. 6B shows an example embodiment for generating a voltage signal as the analog control signal 652. A simple voltage divider circuit is created between supply (Vdd) and ground using two resistors 656 and 658 (R1 and R2). The resulting voltage signal 652 can then be applied to the integrated circuit 104, for example, through a single ID pin 654. It should be appreciated, however, that the voltage signal can be any analog signal, and need not necessarily be a voltage signal. It is further noted that other techniques for generating a voltage value can be used, as desired, instead of the simple resistor divider circuit depicted in FIG. 6B.

The resolution of the ADC 662 can be implemented as desired and can be set depending upon the number of selection options that are desired for the look-up table or other on-chip processing that is to be accomplished utilizing the analog control signal. For example, a three-bit digital output will provide for eight unique selection numbers which can map to eight unique vendor information data entries in a look-up table. An example selection map is illustrated in the following representative table with the resistor values being chosen to generate the desired control voltage value, such that when it is converted, the desired identification information will be accessed. In TABLE 1, the selectable identification information is assumed to be a subsystem vendor identification (SVID) and a subsystem identification (SSID) that relate to the PCI local bus standard.

TABLE 1

EXAMPLE SELECTION MAPPING

| R1 and R2 Values | Digital Output from ADC | SVID | SSID |
| --- | --- | --- | --- |
| Set 1 | 0 | X1 | Y1 |
| Set 2 | 1 | X1 | Y2 |
| Set 3 | 2 | X2 | Y1 |
| Set 4 | 3 | X2 | Y2 |
| Set 5 | 4 | X3 | Y1 |
| Set 6 | 5 | X3 | Y2 |
| Set 7 | 6 | X4 | Y1 |
| Set 8 | 7 | X4 | Y2 |

For this particular table, each of the 8 possible selection numbers maps to both SVID and SSID information. In this table, each set of resistor values determine an analog voltage control signal that is converted to a digital number that in turn corresponds to a given set of SVID and SSID information. As an example, this table provides four different SVIDs (X1, X2, X3, X4) and two different SSIDs (Y1–Y2) for each of these SVIDs. This example would handle circumstances were the product was to be used with four different vendors, each of which were using one of two specific subsystem configurations. It is again noted that the 3-bit example and table set forth above should be taken solely as exemplary. For example, if a five-bit ADC were utilized, there would be 32 possible selections numbers, thereby providing 32 unique numbers that could be utilized to select and access data stored in a look-up table or other database. Furthermore, if two (or more) pins are utilized, for example by employing two resister configurations which each providing a given voltage control signal, then the two signals may be provided to separate ADCs, such as shown in FIG. 8B, and discussed below, whereby each digital number from each ADC may be used to access stored identification information. In addition, differential signaling could be utilized, if desired. For example, if a single-input differential configuration were used, two input pins could together provide a differential analog input such that a positive-side differential analog control signal is applied to the first pin and a negative-side differential analog control signals is applied to the second pin. And the ADC would in turn be configured as a differential ADC to receive the differential input and output a digital selection value.

It is further noted that other information or sets of information could be selected and accessed using the present invention, and the present invention is not necessarily limited to providing identification information for PCI local bus standards or for AC97 standards. For example, the present invention could be utilized for Ethernet network-related integrated circuits to provide information such as network addresses and device IDs, and the present invention could be used in storage solutions to provide information such as storage addresses and device IDs. Thus, the present invention provides a flexible solution for providing programmable information through the use of one or more externally generated analog control signals that are mapped to information stored within the integrated circuit, for example, in an on-chip look-up table or other suitable database that meets the particular needs of the desired application. And these analog control signals, if desired, can be used by themselves for identification, configuration or other device information purposes for the integrated circuit without the use of information from an on-chip look-up table or database. The use of analog control signals for integrated circuit identification, configuration or device information purposes according to the present invention tends to reduce costs by reducing the need for external EEPROM or other more complicated and expensive circuitry that provides identification and/or configuration information to an integrated circuit.

Returning to FIG. 6B, within the host-side DAA circuitry 104, the digital number output from the ADC 662 is used by the control circuitry 665 to locate particular vendor or system identification information from the look-up table 664. The look-up table 664 is preferably integrated as part of the integrated circuit 104, but the identification information could also be stored in an external device that is accessed by the control circuitry 665. The control circuitry 665 may then store this retrieved identification information in ID registers 668, from which the ID information can be reported when an appropriate query is communicated to the integrated circuit 104. Alternatively, the data from the look-up table 664 can be sent directly to an external device upon an appropriate query without that information also being stored in separate ID registers 668. In this alternative embodiment, the digital value from the ADC 662 may be stored by the programmable ID information circuitry 651 and utilized when a query is made to obtain ID information. In this way, for example, host processor 102 can request ID information, and the control circuitry 665 can use the stored digital value from the ADC 662 to access and retrieve the appropriate information from the look-up table 664.

In resistor configuration 650 of FIG. 6B, the signal created by the first and second resistors 656 and 658 is of a given voltage that is specific to the relative resistances of resistors 656 and 658. The signal 652 is sent to ADC 662 through identification pin 654 of the integrated circuit 104. The voltage value for the signal 652 can be readily changed by varying the resistors 656 and 658 and selecting the combination of first and second resistors 656 and 658 that produce a desired voltage for signal 652. Once this voltage signal 652 is converted by ADC 662 to a digital number, the digital number may be mapped to the look-up table 664 to thereby select and retrieve identification information stored in the look-up table. Thus, as shown in TABLE 1 above, the resistor configuration 650 lends itself to the use of two or more sets of resistor pairs from which a selected pair is strapped to the ID pin 654 to produce a desired voltage signal 652. In practice, therefore, if a change in vendor or system identification information is desired, a different set of resistors can then be strapped on the ID pin 654 so that a different voltage signal is provided to the ADC 662, which in turn converts the signal to a different digital number. This new digital number is then compared in the look-up table to provide new identification information. It is again noted that multiple ID pins with associated multiple pairs of resistors may be employed if more extensive vendor identification information is desired. It is also again noted that the resistor circuit shown in FIG. 6B is just one example and other resistor-based or more complex circuits may be used as desired to generate an analog control signal.

Figure 7:
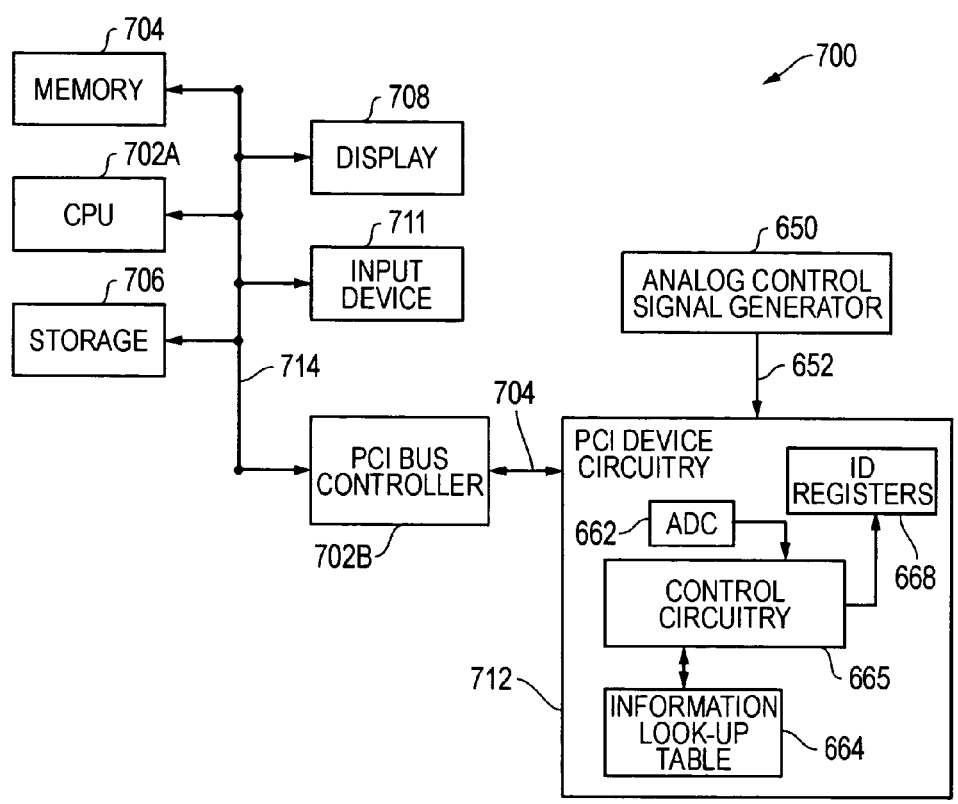
FIG. 7 is a block diagram of a computer system including PCI device circuitry that utilizes an externally generated analog signal to access an information look-up table to load PCI configuration registers with desired identification information.

FIG. 7 is a block diagram of an embodiment 700 of the present invention where the ID information relates to the ID information that meets the PCI local bus standard. In this embodiment, a computer system 700 is depicted that includes a central processing unit (CPU) 702A that may be coupled to various other devices through an interfaces or buses 714, as would be understood to one of skill in the art. For example, the CPU 702A may be coupled to a memory device 704, a storage device 706, a display device 708, an input device 710, and/or other devices. In addition, CPU 702A may be coupled to a PCI bus controller 702B that is configured to meet PCI local bus operational specifications. It is noted that although the digital controller 702B is shown as a separate block in FIG. 7, the PCI control functionality may be located anywhere desired, including on an integrated circuit that is also the CPU 702A. It is also noted that the CPU 702A and the PCI bus controller 702B may together or individually be the host processor 102 in FIGS. 1 and 6A, as desired.

Referring again to FIG. 7, the PCI bus controller 702B is coupled to integrated PCI device circuitry 712 through interface 704. As with the digital controller 702B, the device circuitry 712 in FIG. 7 is configured to meet the PCI local bus standards. According to the present invention, the device circuitry 712 may include at least one integrated circuit that has programmable system identification circuitry. The programmable circuitry may include an on-chip look-up table 664 that holds the vendor ID or other system information or, alternatively, this information, if off-chip, may be suitably coupled to the control circuitry 665. In the embodiment depicted in FIG. 7, the PCI device circuitry 712 includes the vendor ID information in look-up table 664. As discussed above, the analog control signal generator 650 provides an analog control signal 652 to the PCI device circuitry 712. An ADC 662 can then be used to convert this analog signal to a digital value that can be used by the control circuitry 665 to access stored information, such as information stored in the information look-up table 664. If desired, the control circuitry 665 may load ID registers 668 with information from the look-up table 664. The PCI device circuitry 712 may then use the contents of these ID registers 668 to report information to external devices through the interface 704. It is also noted that the controller 702B and the device circuitry 712 could be implemented and designed, as desired, for other interfaces or communication protocols, such as the AC97 interface as discussed above.

FIGS. 8A and 8B show two further embodiments 800 and 850, respectively, of the present invention that can employ analog control signals and can employ resistor configurations to generate those analog control signals. In FIG. 8A, a signal from resistor configuration 650 is provided to ADC 662, which is a part of the vendor identification circuitry and integrated circuit 712. The ADC 662 converts the analog signal to a digital number which maps to vendor ID information in a look-up table. The output from the look-up table is provided to SVID and SSID registers 668A and 668B that can store the accessed information for quick retrieval. When a request for ID information is received by integrated circuit 712, the ID information can be retrieved from the SVID and SSID registers 668A and 668B and then provided externally to the PCI bus 822 through the PCI interface 820. It is again noted that although a SVID and SSID registers are discussed herein, any number of registers or other circuitry configured to receive and store identification information could be utilized, as desired by one implementing devices in accordance with the present invention. It is further noted that the information stored on-chip and then selected and accessed using the analog control signal can be any desired device identification, configuration or system related information and is not necessarily limited to vendor or system identification information.

In FIG. 8B, a multiple resistor configurations 650A and 650B are shown which send analog signals 652A and 652B to ADC1 662A and ADC2 662B, respectively. The digital numbers from ADCs 662A and 662B are again sent to look-up tables, where vendor ID information is accessed. This ID information can then be stored in the SVID register 668A and the SSID register 668B. As with FIG. 8A, when a request for ID information is received by integrated circuit 712, the ID information can be retrieved from the SVID and SSID registers 668A and 668B and then provided externally to the PCI bus 822 through the PCI interface 820. Thus, if desired, multiple analog control signals can be utilized, and each analog control signal can effect a selection of specific information from the same or separate look-up table. Further, the PCI interfaces 820 and registers 668 and 668A–B in FIGS. 8A–B can be implemented and designed, as desired, for other interfaces or communication protocols, such as an AC97 interface.

It is noted that the use of analog control signals to select configuration, identification or other information stored within an integrated circuit, according to an aspect of the present invention, may be implemented in a variety ways. One or more analog control signals may be used. One or more input pins may be used to provide these signals to the integrated circuit. For example, an external multiplexer could be used to alternatively couple one of multiple analog control signals to a single input pin for the integrated circuit. In another implementation, multiple analog control signals could be received through multiple input pins for the integrated circuit. Once received, the analog signals could be converted using one or more ADCs, and again multiplexer circuitry could be used to provide shared access to one or more these ADCs. The digital values output by the ADCs can then be used in a variety of ways to access and utilize information stored within the integrated circuit, such as information stored in a look-up table. Furthermore, a single digital value can be used to access a single set of database, as described with respect to TABLE 1 above. Alternatively, two or more digital values could be utilized in conjunction to determine what data is accessed, and the configuration or identification information can be stored in any efficient manner, as desired, from a simple look-up table to a complex database structure. In short, there are a wide range of possible implementations for utilizing an analog control signal that acts to select on-chip identification information once converted to a digital value, thereby take advantage of the present invention. Still further, if desired, the digital value itself can be used for identification, configuration or other device information purposes for the integrated circuit without utilizing information form an on-chip look-up table or database of identification, configuration or other desired information.

Figure 9:
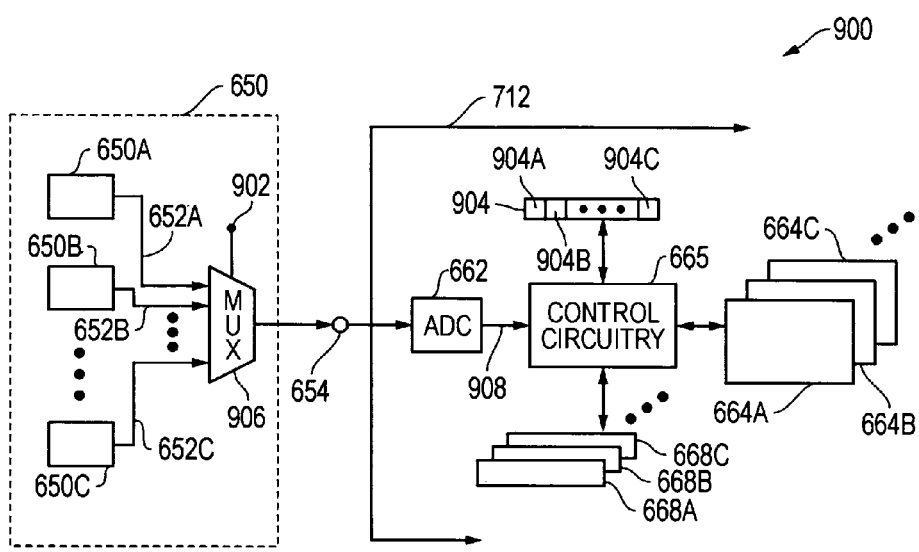
FIG. 9 is a block diagram for an embodiment that utilizes multiple analog control signals that are multiplexed to share a single input pin.

FIG. 9 is an example embodiment 900 of such an implementation that utilizes an analog control signal generator circuitry 650 that includes multiple individual analog control signal generators 650A, 650B . . . 650C that are multiplexed to share single input pin 654 for the integrated circuit 712. In the embodiment depicted, the generator 650A, 650B . . . 650C output analog control signals 652A, 652B . . . 652C, respectively, which are in turn received by a multiplexer 906. A control signal 902 is provided to the multiplexer 906 to determine which of the inputs are provided as an output of the multiplexer 906 to the pin 654. The ADC 662 receives this analog signal and converts it to a digital signal 908 that is received by control circuitry 665. The control circuitry 665 may use this digital signal 908 to obtain information from any of a plurality of different databases 664A, 664B, 664C . . . , and the control circuitry may store information from these databases in any of a plurality of device information registers 668A, 668B, 668C . . . , as desired. The databases may hold identification information, configuration information, operational parameters or other device information, as desired. In addition, if desired, the control circuitry 665 can store the digital signals received at node 908 as digital values 904A, 904B . . . 904C in an appropriate register or database 904. As discussed above, these stored digital values may be used for later retrieval of information from any of the plurality of databases 664A, 664B, 664C . . . and this information may be used directly without first being stored in the registers 668A, 668B, 668C . . . or may be used after first being stored in these registers. Still further, the digital values 904A, 904B . . . 904C can be used individually or in combination by themselves without use of device information from the look-up tables or databases 664A, 664B, 664C . . . , and in such an implementation, these digital values 904A, 904B . . . 904C can still be stored into a register or database 904, if desired, or stored directly into one or more of the device information registers 668A, 668B, 668C . . .

It is noted that the control signal 902 in FIG. 9 can be utilized in a number of ways to allow for the communication of analog control signals to the integrated circuit 712. For example, the control signal 902 may be fixed to select only one of the analog control signals 652A, 652B . . . 652C, such that the integrated circuit utilizes only one analog control signal for its operation. Alternatively, each of the analog control signals can be provided to the integrated circuit 712 for its operations. This transfer of each analog control signal can be accomplished utilizing any desired protocol. For example, the control signal 902 may be controlled such that it cycles from 1 to N to select each analog control signal 652A, 652B . . . 652C and to alternate between these analog signals and a zero level signal. In this way, the integrated circuit 712 could be pre-configured to recognize each zero level as indicating a transition to the next analog control signal. Alternatively, additional pins, such as a 3-pin serial port interface, could be utilized on the integrated circuit to provide for appropriate control signals for the integrated circuit 712.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements may be substituted for those illustrated and described herein, and certain features of the invention may be utilized independently of the use of other features, all as would be apparent to one skilled in the art after having the benefit of this description of the invention.

What is claimed is:

1. Direct-access-arrangement (DAA) circuitry, comprising:
a digital interface within an integrated circuit configured to provide communication with an external processor;
a database within the integrated circuit, the database having identification information stored within it; and
programmable circuitry within the integrated circuit coupled to receive a control signal based upon an input signal from an external source, the programmable circuitry being configured to utilize identification information retrieved from the database based at least in part upon the control signal and to communicate the retrieved identification information to the external processor through the digital interface;
wherein the control signal comprises a multiple-bit digital control signal received through input pins of the integrated circuit, wherein the database comprises a look-up table configured to store multiple sets of vendor identification information, and wherein the digital control signal determines which set of vendor identification information is communicated to the external device.

2. The DAA circuitry of claim 1, further comprising multiple vendor identification registers configured to store the selected set of vendor identification information.

3. Direct-access-arrangement (DAA) circuitry, comprising:
a digital interface within an integrated circuit configured to provide communication with an external processor;

a database within the integrated circuit, the database having identification information stored within it; and programmable circuitry within the integrated circuit coupled to receive a control signal based upon an input signal from an external source, the programmable circuitry being configured to utilize identification information retrieved from the database based at least in part upon the control signal and to communicate the retrieved identification information to the external processor through the digital interface;

wherein the database comprises a look-up table configured to store multiple sets of identification information, and wherein the control signal determines which set of identification information is communicated to the external device.

4. The DAA circuitry of claim 3, wherein the input signal from the external source is an analog signal, and further comprising at least one analog-to-digital converter (ADC) within the integrated circuit coupled to receive the analog signal and to provide a digital output signal as the control signal to the programmable circuitry.

5. The DAA circuitry of claim 4, wherein the analog control signal comprises a voltage control signal.

6. The DAA circuitry of claim 3, wherein the digital interface is configured to operate within PCI local bus operational specifications or within AC97 operational specifications.

7. The DAA circuitry of claim 6, wherein the programmable circuitry further comprises multiple registers, each capable of storing PCI or AC97 related system identification information retrieved from the look-up table.

8. A programmable information selection system for an integrated circuit, comprising:

a database integrated within an integrated circuit, the database having a plurality of sets of information stored within it; and programmable circuitry within the integrated circuit coupled to the database and coupled to receive a control signal based upon at least one external analog control signal received as an input to the integrated circuit, the programmable circuitry being configured to select from the sets of stored information depending at least in part upon the control signal;

wherein the database comprises a look-up table and wherein the sets of information are stored within the look-up table as selectable sets of information, the control signal determining what data is accessed and stored in information registers.

9. The programmable information selection system of claim 8, further comprising at least one analog-to-digital converter (ADC) within the integrated circuit coupled to receive the external analog control signal through at least one input pin for the integrated circuit and to provide a digital selection value as the control signal to the programmable circuitry.

10. The programmable information selection system of claim 9, wherein the external analog control signal is a voltage signal.

11. The programmable information selection system of claim 10, further comprising external circuitry coupled to provide the voltage signal to the integrated circuit and wherein the external circuitry comprises resistor circuitry.

12. The programmable information selection system of claim 11, wherein multiple resistor configurations for the resistor circuitry are mapped to information stored in the database, such that a selection of one of the resistor configurations determines at least in part the information selected and utilized from the database.

13. The programmable information selection system of claim 12, wherein the resistor circuitry comprises at least two resistors coupled together to form a resistor divider circuit, the resistor divider circuit providing the voltage control signal to the integrated circuit, and wherein the multiple resistor configurations comprises different sets of resistor values for the at least two resistors.

14. The programmable information selection system of claim 8, wherein the information stored in the look-up table comprises system identification information according to the PCI local bus standard or the AC97 component specification.

15. A computer system having direct-access-arrangement (DAA) circuitry configured to couple the computer system to telephone lines, comprising:

a processor;

a digital controller coupled to the processor and configured to operate within PCI local bus operational specifications or within AC97 operational specifications;

digital-access-arrangement (DAA) circuitry including at least one integrated circuit, the DAA circuitry being coupled to the digital controller and configured to operate within PCI local bus operational specifications or within AC97 operational specifications;

a database within the integrated circuit, the database configured to store identification information; and programmable circuitry included within the integrated circuit, the programmable circuitry being configured to retrieve identification information from the on-chip database based at least in part upon a control signal based upon an input signal provided from a source external to the integrated circuit;

wherein the database comprises a look-up table configured to store multiple sets of identification information, and wherein the control signal determines which set of identification information is utilized by the DAA circuitry.

16. The computer system of claim 15, wherein the programmable circuitry comprises multiple registers, each capable of storing identification information.

17. The computer system of claim 15, wherein the input signal provided from a source external to the integrated circuit is an analog control signal, and further comprising at least one analog-to-digital converter (ADC) within the integrated circuit coupled to receive the analog control signal and to provide a digital output signal as the control signal to the programmable circuitry.

18. The computer system of claim 17, wherein the analog control signal comprises a voltage signal.

19. The computer system of claim 18, further comprising external circuitry coupled to provide the voltage signal to the integrated circuit and wherein the external circuitry comprises resistor circuitry.

20. A method for reporting identification information from direct-access-arrangement (DAA) circuitry to an external device, comprising:

storing identification information within a database within an integrated circuit;

receiving a control signal from an external source; and utilizing identification information retrieved from the database based at least in part upon the control signal, and communicating the identification information to an external processor;

wherein the control signal comprises a multiple-bit digital control signal, wherein the receiving step comprises receiving the multiple-bit digital control signal through input pins of the integrated circuit, wherein the database comprises a look-up table configured to store multiple sets of vendor identification information, and wherein the digital control signal determines which set of vendor identification information is communicated to the external device.

21. The method of claim 20, further storing the selected set of vendor identification information within multiple vendor identification registers.

22. A method for reporting identification information from direct-access-arrangement (DAA) circuitry to an external device, comprising:
storing identification information within a database within an integrated circuit;
receiving a control signal from an external source; and
retrieving identification information from the database based at least in part upon the control signal, and
communicating the identification information to an external processor;
wherein the database comprises a look-up table configured to store multiple sets of identification information, and wherein the control signal determines which set of identification information is communicated to the external device.

23. The method of claim 22, further comprising receiving through at least one input pin an analog control signal as the control signal from the external source, converting the analog control signal to a digital output signal, and utilizing the digital output signal in the retrieving step.

24. The method claim 23, wherein the analog control signal comprises a voltage control signal.

25. The method of claim 22, wherein communicating step comprises communicating through a digital interface and wherein the digital interface is configured to operate within PCI local bus operational specifications or within AC97 operational specifications.

26. The method of claim 25, further comprising storing PCI related or AC97 related system identification information retrieved from the look-up table in a plurality of registers.

27. A method for selecting information from a database within an integrated circuit, comprising:
providing a database within an integrated circuit;
storing within the database a plurality of sets of information;
receiving at least one external analog control signal as an input; and
selecting from the sets of stored information depending at least in part upon the analog control signal;
wherein the database comprises a look-up table and wherein the sets of information are stored within the look-up table as selectable sets of information, the control signal determining what data is accessed and stored in a plurality of registers.

28. The method of claim 27, further comprising converting the analog control signal to a digital control signal with an analog-to-digital converter (ADC).

29. The method of claim 28, wherein the external analog control signal is a voltage signal.

30. The method of claim 29, further comprising providing external circuitry coupled to provide the voltage signal to integrated circuitry and wherein the external circuitry comprises resistor circuitry.

31. The method of claim 30, further comprising mapping multiple resistor configurations for the resistor circuitry to information stored in the database, such that a selection of one of the resistor configurations determines at least in part the information selected and utilized from the database.

32. The method of claim 30, wherein the resistor circuitry comprises at least two resistors coupled together to form a resistor divider circuit, the resistor divider circuit providing the voltage control signal to the integrated circuit, and wherein the multiple resistor configurations comprises different sets of resistor values for the at least two resistors.

33. The method of claim 27, wherein the information stored in the look-up table comprises subsystem vendor identification information (SVID) and subsystem identification information (SSID) according to the PCI local bus standard.

34. A method of selecting information from an on-chip database for a computer system having direct-access-arrangement (DAA) circuitry configured to couple the computer system to telephone lines, comprising:
providing a digital controller coupled to a processor and configured to operate within PCI local bus operational specifications or within AC97 operational specifications;
providing digital-access-arrangement (DAA) circuitry including at least one integrated circuit, the DAA circuitry being coupled to the digital controller and configured to operate within PCI local bus operational specifications or within AC97 operational specifications;
storing information in a database within the integrated circuit;
receiving a control signal with the DAA circuitry, the control signal being provided from a source external to the integrated circuit; and
retrieving information from the on-chip database based at least in part upon the control signal;
wherein the database comprises a look-up table configured to store multiple sets of identification information, and wherein the control signal determines which set of identification information is utilized by the DAA circuitry.

35. The method of claim 34, storing the retrieved information in multiple registers.

36. The method of claim 34, wherein the receiving step comprises receiving at least one analog control signal and further comprising converting the analog control signal to a digital control signal with an analog-to-digital converter (ADC) and utilizing the digital control signal for the retrieving step.

37. The method of claim 36, wherein the analog control signal comprises a voltage signal.

38. The method of claim 37, further providing external circuitry coupled to provide the voltage signal to integrated circuitry and wherein the external circuitry comprises resistor circuitry.

39. Programmable device information circuitry for an integrated circuit, comprising:
at least one external pin for an integrated circuit configured to receive at least one analog control signal;
analog-to-digital conversion circuitry within the integrated circuit coupled to receive the external analog control signal and to output a digital value;
at least one device information register;
control circuitry within the integrated circuit coupled to the analog-to-digital converter, the control circuitry being configured to store device information in the device information register depending at least in part upon the digital value; and a database within the integrated circuit, the database having a plurality of sets of information stored within it, and wherein the control circuitry is configured to select device information from the sets of stored information to store the selected device information in the device information register;

wherein the database comprises a look-up table and wherein the sets of information are stored within the look-up table, the digital value determining what data is accessed and stored in the device information register.

40. The programmable device information circuitry of claim 39, wherein the control circuitry is configured to store the digital value in the device information register.

41. The programmable device information circuitry of claim 39, further comprising a database within the integrated circuit, the database having a plurality of sets of information stored within it, and wherein the control circuitry is configured to select device information from the sets of stored information to store the selected device information in the device information register.

42. The programmable device information circuitry of claim 39, wherein the analog control signal is a voltage signal.

43. The programmable device information circuitry of claim 42, further comprising external circuitry coupled to provide the voltage signal to integrated circuitry and wherein the external circuitry comprises resistor circuitry.

44. The programmable device information circuitry of claim 43, wherein multiple resistor configurations for the resistor circuitry are mapped to information stored in the database, such that a selection of one of the resistor configurations determines at least in part the information selected and utilized from the database.

45. The programmable device information circuitry of claim 43, wherein the resistor circuitry comprises at least two resistors coupled together to form a resistor divider circuit, the resistor divider circuit providing the voltage control signal to the integrated circuit.

46. The programmable device information circuitry of claim 39, wherein the sets of information are stored within the look-up table as selectable rows of information.

47. The programmable device information circuitry of claim 39, wherein the analog control signal comprises a differential signal received across two external pins for the integrated circuit.

48. A method for programming device information for an integrated circuit, comprising:

receiving at least one analog control signal as an input to at least one external input pin of an integrated circuit; and converting the analog control signal to a digital value;

storing device information in at least one device information register depending at least in part upon the digital value; and providing a database within the integrated circuit, the database having a plurality of sets of information stored within it, selecting device information from the sets of stored information based upon the digital value, and storing the selected device information in the device information register;

wherein the database comprises a look-up table and wherein the sets of information are stored within the look-up table, the digital value determining what data is accessed and stored in the device information register.

49. The method of claim 48, further comprising storing the digital value in the device information register.

50. The method of claim 48, wherein the analog control signal is a voltage signal.

51. The method of claim 50, further comprising providing external circuitry coupled to provide the voltage signal to integrated circuitry and wherein the external circuitry comprises resistor circuitry.

52. The method of claim 51, further comprising mapping multiple resistor configurations for the resistor circuitry to information stored in the database, such that a selection of one of the resistor configurations determines at least in part the information selected and utilized from the database.

53. The method of claim 51, wherein the resistor circuitry comprises at least two resistors coupled together to form a resistor divider circuit, the resistor divider circuit providing the voltage control signal to the integrated circuit.

54. The method of claim 48, wherein the sets of information are stored within the look-up table as selectable rows of information.

55. The method of claim 48, wherein the analog control signal comprises a differential signal received across two external pins for the integrate circuit.

* * * * *